US008283239B2

(12) United States Patent
Beaumont et al.

(10) Patent No.: US 8,283,239 B2
(45) Date of Patent: Oct. 9, 2012

(54) PROCESS FOR GROWTH OF LOW DISLOCATION DENSITY GAN

(75) Inventors: Bernard Beaumont, Le Tignet (FR); Jean-Pierre Faurie, Valbonne (FR); Pierre Gibart, Chateauneuf Grasse (FR); Therese Gibart, legal representative, Chateauneuf Grasse (FR)

(73) Assignee: Saint-Gobain Cristaux & Detecteurs, Courbevoie (FR)

( * ) Notice: Subject to any disclaimer, the term of this patent is extended or adjusted under 35 U.S.C. 154(b) by 0 days.

(21) Appl. No.: 12/086,674

(22) PCT Filed: Dec. 15, 2006

(86) PCT No.: PCT/EP2006/069767
§ 371 (c)(1),
(2), (4) Date: Jun. 12, 2008

(87) PCT Pub. No.: WO2007/068756
PCT Pub. Date: Jun. 21, 2007

(65) Prior Publication Data
US 2009/0278136 A1    Nov. 12, 2009

Related U.S. Application Data

(60) Provisional application No. 60/751,387, filed on Dec. 15, 2005.

(51) Int. Cl.
*H01L 21/20* (2006.01)
*H01L 21/36* (2006.01)
(52) U.S. Cl. .......... 438/478; 257/E21.09; 257/E21.108; 257/E21.097; 257/E29.089
(58) Field of Classification Search .................. 438/478; 257/E21.09, E21.108, E29.089
See application file for complete search history.

(56) References Cited

U.S. PATENT DOCUMENTS

| 6,325,850 | B1 | 12/2001 | Beaumont et al. |
| 6,348,096 | B1 | 2/2002 | Sunakawa et al. |
| 6,500,747 | B1 | 12/2002 | Lee et al. |
| 6,599,362 | B2 | 7/2003 | Ashby et al. |
| 6,623,560 | B2 * | 9/2003 | Biwa et al. ................ 117/95 |
| 6,656,269 | B2 * | 12/2003 | Tomioka ................ 117/89 |
| 6,673,149 | B1 | 1/2004 | Solomon et al. |
| 6,699,760 | B2 | 3/2004 | Hsu et al. |

(Continued)

FOREIGN PATENT DOCUMENTS
EP    1 246 233 A2    10/2002
(Continued)

OTHER PUBLICATIONS

"Self-organized domain formation in low-dislocation-density GaN," T. Riemann, et al., *Superlattices and Microstructures*, vol. 36, 2004, pp. 833-847.

(Continued)

*Primary Examiner* — William D Coleman
*Assistant Examiner* — Christine Enad
(74) *Attorney, Agent, or Firm* — Abel Law Group, LLP

(57) ABSTRACT

High quality free standing GaN is obtained using a new modification of the Epitaxial Lateral Overgrowth technology in which 3D islands or features are created only by tuning the growth parameters. Smoothing these islands (2D growth) is achieved thereafter by setting growth conditions producing enhanced lateral growth. The repetition of 3D-2D growth results in multiple bending of the threading dislocations thus producing thick layers or free standing GaN with threading dislocation density below $10^6$ cm$^{-2}$.

17 Claims, 5 Drawing Sheets

U.S. PATENT DOCUMENTS

| | | | |
|---|---|---|---|
| 6,802,902 B2* | 10/2004 | Beaumont et al. | 117/95 |
| 7,445,673 B2* | 11/2008 | Beaumont et al. | 117/94 |
| 2003/0085411 A1 | 5/2003 | Shibata et al. | |
| 2003/0207125 A1 | 11/2003 | Sunakawa et al. | |
| 2004/0094084 A1 | 5/2004 | Ouchi et al. | |
| 2004/0124435 A1 | 7/2004 | D'Evelyn et al. | |
| 2004/0137732 A1* | 7/2004 | Frayssinet et al. | 438/689 |
| 2005/0042789 A1* | 2/2005 | Fujikura et al. | 438/47 |
| 2005/0217565 A1* | 10/2005 | Lahreche et al. | 117/84 |

FOREIGN PATENT DOCUMENTS

| | | |
|---|---|---|
| WO | WO 2004/105108 A2 | 12/2004 |
| WO | 2007068756 A1 | 6/2007 |

OTHER PUBLICATIONS

"Stress control in GaN/sapphire templates for the fabrication of crack-free thick layers," J. Napierala, et al., *Journal of Crystal Growth*, vol. 289, 2006, pp. 445-449.

"The effect of the Si/N treatment of a nitridated sapphire surface on the growth mode of GaN in low-pressure metalorganic vapor phase epitaxy," S. Haffouz, et al., *Applied Physics Letters*, vol. 73, No. 9, Aug. 31, 1998, pp. 1278-1280.

I. Grzegory et al., "GaN substrates for molecular beam epitaxy growth of homoepitaxial structures," Elsevier, Thin Solid Films 367, dated 2000, pp. 281-289.

Ok-Hyun Nam et al., "Lateral epitaxy of low defect density GaN layers via organometallic vapor phase epitaxy," American Institute of Physics, Applied Physics Letters 71 (18), dated Nov. 3, 1997, 4 pages.

S. Gradecak et al., "Bending of dislocations in GaN during epitaxial lateral overgrowth," Applied Physics Letters, vol. 85, No. 20, dated Nov. 15, 2004, 4 pages.

S.K. Mathis et al., "Modeling of threading dislocation reduction in growing GaN layers," Elsevier, Journal of Crystal Growth 231, dated 2001, pp. 371-390.

Yoshiaki Honda et al., "Transmission Electron Microscopy Investigation of Dislocations in GaN Layer Grown by Facet-Controlled Epitaxial Lateral Overgrowth," The Japan Society of Applied Physics, vol. 40, Part 2, No. 4A, dated Apr. 1, 2001, pp. L309-L312.

B. Beaumont et al., "Epitaxial Lateral Overgrowth of GaN," Wiley-VCH Verlag Berlin GmbH, Phys. Stat. Sol. (b) 227, No. 1, dated 2001, pp. 1-43.

* cited by examiner

PROCESS FOR GROWTH OF LOW DISLOCATION DENSITY GAN

This is a non-provisional application claiming the benefit of International application number PCT/EP2006/069767 filed Dec. 15, 2006, which claims priority to U.S. Provisional Patent Application No. 60/751,387, filed Dec. 15, 2005.

FIELD OF THE INVENTION

The invention relates to a process for growth of low dislocation density GaN on a substrate, and more particularly, to a process for epitaxial growth where the lateral and vertical growth rates of the material are controlled only by growth conditions. It also relates to a nitride semiconductor wafer having a GaN crystal formed by such a method and a nitride semiconductor device produced there from.

DESCRIPTION OF THE RELATED ART

GaN-based compound semiconductors, such as gallium nitride (GaN), the ternary alloys, indium gallium nitride (InGaN) and gallium aluminium nitride (GaAlN) and even the quaternary (AlGaInN) are direct band gap semiconductors. Their band gaps cover wavelengths extending from visible to UV. Henceforth, nitride alloy semiconductors are recognized as having great potential for short wave length emission. GaN is used in the manufacture of light emitting diodes (LEDs), blue-violet laser diodes (LDs) and UV detectors. The next generation of high density disc systems (blu-ray DVD and HD-DVD) will require GaN blue-violet LD. In addition to optoelectronics, due to its intrinsic properties (wide gap, high thermal and chemical stability, high electron saturation velocity), GaN will be used as well in the fabrication of high-temperature electronics devices.

Unfortunately, the development of nitride materials has been hampered by problems in the processing technology of such materials. One of the most important problems in the development of III-N devices is the lack of gallium nitride bulk substrates of acceptable usable area or of lattice-matched substrates for growth of low-defect density III-N layers. GaN is not found in nature; it cannot be melted and pulled from a boule like silicon, gallium arsenide, or sapphire, because at usual pressures its theoretical melting temperature exceeds its dissociation temperature. Substantial difficulties have been shown when attempting to obtain large-area crystals of any Group III-nitride that could provide suitable substrates for device fabrication. GaN bulk crystals can be grown by high pressure high temperature melt growth in liquid Ga. This technology has been developed previously, but the size of the substrate (~1 $cm^2$) and the volume of the potential mass production do not reach by far the industrial needs. Nevertheless low defect densities ~$10^2$ to $10^5$ $cm^2$ have been achieved using this method. (I. Grzegory and S. Porowski, Thin Solid Films, 367, 281 (2000))

The techniques currently used for the fabrication of relatively high quality GaN and related layers involve the heteroepitaxial deposition of a GaN device layer onto a suitable but non-ideal substrate. Currently such substrates include (but are not limited to) sapphire, silicon, GaAs or silicon carbide. All heteroepitaxial substrates present challenges to the high-quality deposition of GaN, in the form of lattice and thermal mismatch. Lattice mismatch is caused by the difference in interatomic spacing of atoms in dissimilar crystals. Thermal mismatch is caused by differences in the thermal expansion coefficient between dissimilar materials.

Since the lattice constant of a sapphire substrate differs from that of GaN, a continuous GaN single crystalline film cannot be grown directly on the sapphire substrate. Therefore, a process wherein the strain of the lattice is relieved in a buffer layer of AlN or GaN grown on the sapphire substrate at a low temperature, and then GaN is grown thereon, has been proposed, and is currently achieved routinely. The use of a nitride layer grown at a low temperature as a buffer layer has enabled the single-crystalline epitaxial growth of GaN. However, even this method cannot compensate the lattice-mismatch between the substrate and the crystal, and the GaN film has still numerous defects.

Sapphire and SiC have become the standard substrates for III-N growth, despite significant lattice mismatches. Such large mismatches lead to the formation of very high densities of threading dislocations (TD) (~$10^9$ $cm^{-2}$) and eventually cracks. Thermal mismatch should also be considered. Typically, after the GaN is grown, as the sample cools to room temperature, the difference in thermal expansion (contraction) rates gives rise to high levels of stress at the interface between the two materials. Sapphire has a higher coefficient of thermal expansion than does GaN. As the sapphire substrate and GaN layer cool down, the mismatch at the interface puts the GaN under compression and the sapphire under tension. Thus, the amount of stress is directly related to the thickness of the deposited GaN, such that the thicker the film, the greater the stress. Above a film thickness of about 10 microns, the stress levels exceed the fracture limits of the GaN, and cracking of the film may result. Cracks in this layer are even less desirable than high dislocation densities since they may propagate during the processing of device structure. All the technological development of the epitaxy of GaN or sapphire or SiC aims to reduce the TD density and avoid crack formation.

The existence of extended defects (threading dislocations, stacking faults, and antiphase boundaries) leads to significantly deteriorated performances and results in a shortened operating lifetime of devices. More specifically, the dislocations behave as nonradiative centres, thus reducing the light-emitting efficiency of light-emitting diodes and laser diodes made from these materials. These dislocations also increase the dark current. Although threading dislocations have not prevented the development of high-brightness light-emitting diodes, the dislocations cause excessive reverse-bias leakage currents in p-n junction devices such as high-electron-mobility transistors, field-effect transistors and other electronic devices. Further, the dislocations can act as strong scattering centres for carriers, thus reducing the mobility of electrons and holes, limiting the performance of many semiconductor devices.

Numerous methods to reduce the TD and other extended defect density have been proposed.

Historically, Hydride Vapor Phase Epitaxy (HVPE) was the first method to produce epitaxial layers in the early 1970s. Because HVPE was unable to produce p-type GaN, it was largely abandoned in the early 1980s. Nowadays, the renewed interest in this method ties in its ability to grow GaN at high growth rates and thereby allow the fabrication of pseudo-substrates or free standing GaN. An analysis of the reduction mechanisms in GaN proposed by Mathis et al, J. Cryst. Growth, 2001, predicts a decrease of the TD as a function of the thickness h as $h^{-2/3}$. This means that very thick layers (~300 µm) are required to reduce the TDs below $10^7$ $cm^{-2}$. In other words, by growing thicker layers more interactions between dislocations can take place. Indeed interactions are more efficient close to the interface where more mixed dislocations are present. As the layer becomes thicker, this leaves primarily edge dislocations with larger separation, therefore interactions become less and less likely and a further decrease of the density of TDs becomes difficult. Free-standing GaN with TDs densities of $3\times10^6$ cm$^{-2}$ were obtained following this process.

Other HVPE technologies have been developed to enhance the rather inefficient TD annihilation process like tuning growth conditions at the early stage of the growth to favour annihilation of TD through formation of dislocation loops, Hsu et al, U.S. Pat. No. 6,699,760. (rough surface).

Another alternative to get low defect stress relieved HVPE GaN on a sapphire substrate is described in U.S. Pat. No. 6,673,149. Such a technology involves the deposition of a defect rich layer (to release the stress) and another layer which smoothes out the growing surface and provide high quality layer. Such a process relies on two growing conditions like high-low growth rate.

Techniques for reducing the density of crystalline defects using Epitaxial Lateral Overgrowth (ELO) are widely documented, see for instance Phys. Stat. Sol., 2001, (b) 227, p 1-43. ELO involves at least two growth steps. ELO takes advantage of the faster growth of GaN in one given crystallographic direction to produce lower dislocation densities (less than approximately $10^7$ cm$^{-2}$). Nam et al. (Appl. Phys. Lett., 1997, 71(18), 2638-2640) describe the production of III-V semiconductor materials using ELO. This ELO method requires an initial growth of a GaN layer on a substrate, removal from the growth reactor, ex-situ processing, deposition of dielectric masks, and re-insertion into the growth reactor. Various etching and other processing steps are included.

In the standard ELO technology, growth process is tailored to promote lateral growth where TDs are not propagating. However, TDs dislocations are still propagating above the opening in the mask and devices like LD should be made on stripe above the masked area.

In the two-step ELO these drawbacks are to some extend avoided. Actually, in the first step, the growth conditions of GaN are adjusted to produce triangular stripes with {11-22} lateral facets. The growth rate $G_C$ of the top (0001) facet is higher than the growth rate $G_S$ of the inclined {1122} lateral facets. The ratio $G_C/G_S$ is typically 3. The first step is pursued until the top facet completely vanishes. Then, in a second step, the lateral growth is favoured $G_S>G_C$ until complete coalescence and smoothing of the surface. Increasing the lateral growth rate can be achieved either by increasing the temperature, or introducing Mg in the vapour phase, or decreasing the pressure. The dislocations above the window first propagate vertically, (as in the standard-ELO), but afterwards bend by 90° to adopt a direction along the (0001) basal plane. The bending of most of the dislocations results in a drastic reduction of their density in the upper part of the film, i.e. for a thickness greater than the height of the pyramids obtained at the end of the first growth step. After bending, most of the dislocations have a line parallel to [1-210] which extends to the coalescence boundary with the overgrown GaN coming from the adjacent stripe. The boundary is therefore an area of defect accumulation. Several types of behaviours of the dislocations in the boundary have been observed:
  bending down to the void resulting in their termination therein,
  bending up in the boundary and threading up to the surface.
  a half loop is formed between two dislocations having the same Burger vector but coming from adjacent overgrowth. However, TDs that did not bent downwards or create a half loop, merge on the surface.

TDs bending can be explained qualitatively, from a simple free energy minimization viewpoint:
  the Burgers vector of the TDs is not normal to the surface; this causes a straight dislocation line to feel forces tending to orient it at a certain angle to the normal. These forces acting on such a line are the sum of two terms, one acts to rotate the line so that it is normal to the surface, while the second term acts to align the dislocation with the Burgers vector. As the line energy of a dislocation depends also of its character, the energy of a screw being the lowest, bending at 90° of a edge eventually produce a screw dislocation, or introduce a screw component thus lowering the enthalpy of the system. This behaviour of TD in the 2S-ELO technology has been recently quantified using the anisotropic elasticity theory to calculate dislocations energies in GaN as a function of their line direction, S. Gradečak et al, Appl. Phys. Lett., 85, 4648 (2004).

Two-step ELO, also called FACELO (Jpn. J. Appl. Phys., 2001, 40, L309) or FIELO (U.S. Pat. No. 6,348,096) and cantilever Epitaxy (CE) as described in U.S. Pat. No. 6,599,362 are other efficient attempt of reducing the TDs density. Actually these methods involve the same basic mechanisms than in ELO.

ELO technologies have also been implemented in HVPE, but due to the high growth rate, wide pitch of the ELO openings in masks are required and new dislocations are often generated. HVPE is currently widely used to grow thick GaN layers to be eventually removed from the substrate.

Mask less technologies have also been implemented. Most of them require grooving trenches in either a GaN layer or in the substrate to induce TD density reduction characteristic of the ELO process. Alternatively, textured GaN surface can also be obtained by etching as described in US 2003/0085411, U.S. Pat. No. 6,500,747 and US 2003/0207125.

ALFAGEO for Asymmetric Lateral Facet Growth Epitaxial Overgrowth is a new variation derived from the two-step ELO technology (U.S. Pat. No. 6,325,850). In the two-step ELO technology, when a TD, which tends to become normal to the growing facet, feels a symmetric structure of growing planes, either normal to a (0001), or in a symmetry plane of two lateral facets, it does not bend. This is typically the behaviour of TDs at the apex of the triangular stripes or in the middle of the mask. To induce a 90° bending of these particular TD, a new lateral facet {1122} has to be created at some stage of the ELO process. To favour a new bending of TDs having already experienced a 90° bending, once again a new lateral facet has to appear. These multiple bending enhance the probability of creating half loops. This is illustrated in FIG. 1 where ELO was initiated from mask openings of different size. Since the particular design of the mask results in twice the appearance of lateral facets (FIG. 1), TDs of type 1 or 2 may experience multiple bending. This indeed results in lateral growth from coherent GaN pyramids, but of different size.

The inventors have discovered that the islands or features may be obtained without necessarily the creation of an intrinsic mask, but through the growth conditions. In the present invention, the coherent array of islands does not result from any kind of masking, nor roughening the GaN surface, nor etching, nor grooving but by properly tuning the growth conditions. Furthermore, this method is applicable not only in MOVPE, but also in HVPE, CSVT and LPE.

The present invention is based upon the Universal Lateral Overgrowth (ULO) process of reduction of TDs, and aims to produce low dislocation density free standing GaN using a new TD reduction mechanism. Threading dislocation density is estimated either on the basis of Atomic force Microscopy (AFM), which allows to counts edge and mixed dislocations, or by Cathodoluminescence (CL). In CL each merging dislocation gives a dark spot.

ULO does not require any external action to occur since it is controlled only by a proper adjustment of the growth conditions, and it can be applied several times during a run. It has the further advantage of avoiding any ex-situ processing and re-insertion into the growth reactor. The present invention thereby furnishes a process which implementation is easier, and easily transposed industrially.

SUMMARY OF THE INVENTION

An object of the present invention is to provide a method of manufacturing thick GaN substrates having an extremely low defect density and little warp and bow by the ULO process without using any kind of mask, nor roughening, nor etching, nor grooving the GaN surface, and only by changing the operating pressure in the growth chamber, the partial pressure, the temperature, the V/III ratio and/or by the addition of surfactant or antisurfactant chemical species in the vapour phase.

The present invention also provides a method for the production of thick, crack-free, layers of GaN for subsequent use as pseudo-substrates or substrates after separation of the starting non-GaN native substrate for homoepitaxy.

Another object of the invention is the free standing GaN obtained by a process according to the present invention.

DETAILED DESCRIPTION OF THE INVENTION

Figure 1:
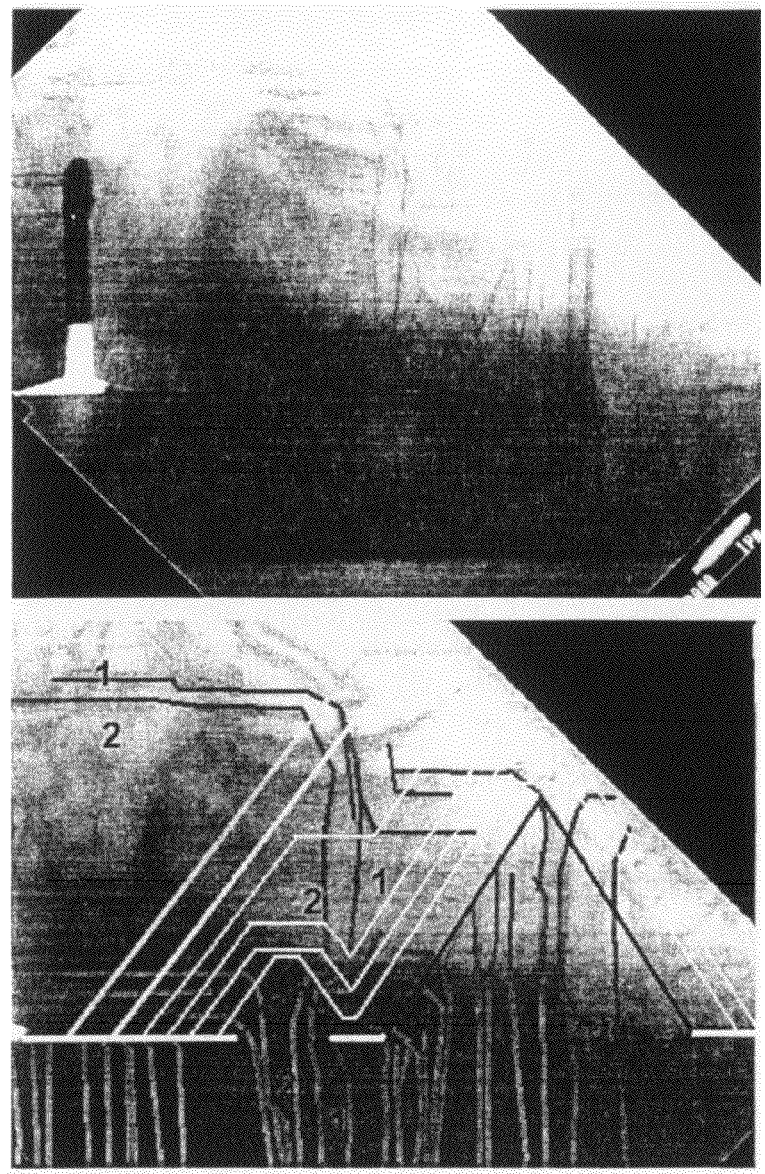
FIG. 1 TEM image of ELO GaN grown from asymmetric openings (ALFAGEO). TDs are bent several times when they meet the lateral facets {1-101}(a), scheme of the multibending mechanism (b).

Advanced optoelectronic devices require low threading dislocation densities $<10^6$ cm$^{-2}$. The most widely used surface is the (0001) Ga face, which should have a surface epiready for the direct growth of device structures thereon. Besides, the crystallographic orientation should not deviate from the (0001) orientation otherwise gradient gradients of In incorporation may occur during of LD or LED structure on vicinal planes.

An object of the present invention is a method of manufacturing low defect density GaN involving the following steps:
a) growth of an epitaxial layer of GaN on starting substrate,
b) subsequent growth of a GaN layer at low temperature to induce island features
c) growth atop of a GaN layer at conditions where lateral growth is enhanced until full coalescence of the island features and achievement of a smooth flat surface, characterized in that,
step b) is achieved without using any kind of mask, nor roughening, nor etching, nor grooving the GaN surface, and only by changing the operating pressure in the growth chamber, the partial pressure, the temperature, the V/III ratio and/or by adding surfactant or antisurfactant chemical species in the vapour phase.

The growth conditions of this first GaN layer are tuned to produce a non-flat surface, more specifically a coherent array of islands with different size thereby generating a ULO process. 90° bending of TD takes place inside these islands.

In a further step of the process, the growth conditions are changed to enhance growth in the lateral direction from the random array of coherent islands to get a smooth surface.

These two growth steps can be eventually repeated thereby inducing multiple bending of the TDs and creation of dislocation loops.

Thus another object of the invention is a method as described above, wherein the steps b) and c) of subsequent growth of GaN to produce island features and smooth surface is repeated several times.

At the end of this step a flat GaN surface is achieved with a thickness exceeding 100 μm.

Finally, free-standing GaN of the present invention exhibit TD densities $<10^6$ cm$^{-2}$.

Growth of GaN on starting substrate may occur through MOPVE or by any other ELO related technology well known by the skilled person in the art. Among these methods, mentioned may be made of HVPE, CSVT, or LPE.

Subsequent growth of GaN in steps b) and c) may also occur through one method chosen in the group consisting of MOVPE, HVPE, CSVT, or LPE. Advantageously it is carried out by a HVPE technique.

In the method according to the present invention, the starting substrate may advantageously be chosen from the group formed by Sapphire, spinet, GaN, AlN, GaAs, Si, SiC (6H-, 4H-, 3C-), LiAlO$_2$, LiGaO$_2$, ZrB$_2$ and HfB$_2$.

Even though a large strain results from the difference in the thermal expansion coefficients between the gallium nitride layer and the sapphire substrate, the sapphire substrate can be removed using methods well know by the person skilled in the art like, but not limited to laser lift off, $H^+$ implantation, strained induced separation.

DESCRIPTION OF THE PREFERRED EMBODIMENTS

In a first preferred embodiment, the GaN/sapphire template is achieved by MOVPE methods, well known from the skilled person in the art. Then, the subsequent deposition of GaN layer is carried out by a HVPE technique.

The HVPE process is a chemical vapour deposition method carried out in a hot wall reactor. The gallium precursor, gallium monochloride GaCl employed in the deposition process is formed within the reactor, upstream from the GaN/sapphire templates, by the reaction of HCl with liquid Ga, at high temperature. GaCl is then transported by a carrier gas to the substrate downstream in the reactor where it reacts with NH$_3$ at a temperature between 800-1200° C. to form GaN, via the reaction:

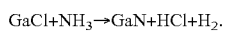
$GaCl+NH_3 \rightarrow GaN+HCl+H_2$.

Due to the relatively low vapour pressure of GaCl, the vapour tends to condense on unheated surfaces, thereby requiring the in situ synthesis GaCl in a reactor operating under hot wall conditions. This avoids an otherwise complicated gas delivery and gas inlet heating system required for external gaseous precursor and storage.

In HVPE growth of GaN, Ga metal can be readily obtained with a purity of more than 99.9999% and with a properly designed gas delivery system, HCl gas with purity more than 99.99% purity can be provided using an appropriate in line getter.

To obtain desired high throughput with acceptable overall process duration, growth rates in excess of 50 µm/hr are advantageously employed. Growth is beneficially carried out at temperatures between about 900 and about 1150° C.

The MOVPE/sapphire templates are introduced in a multiwafer HVPE reactor operating at low pressure, without any further technological step like cleaning or etching.

The invention provides an HVPE nitride growth reactor, which is particularly designed for growth of GaN thick epitaxial films. More specifically, this HVPE reactor allows holding 6×2" wafers on a rotating susceptor. The reactor is configured in a resistively heated furnace tube in the conventional manner, with the furnace being vertically oriented. The reactor provides two distinct parts, namely, one for the GaCl synthesis, and the growth chamber. With this configuration, GaCl is formed in situ upstream of the growth chamber, into which it is then delivered. In the growth chamber, a susceptor supports up to 6 GaN/sapphire templates on which the epitaxial layer is to be grown. GaCl is delivered to the growth chamber in the vicinity of the susceptor to achieve the growth process. NH3 is also delivered in the vicinity of the susceptor in such a way that premature mixing with GaCl is avoided.

Additionally, "impurities" (doping species, surfactants, transition metal) can be added during growth of the thick GaN layer. Mention may be made of Mg, Bi, Sb, Si, or O. By way of example, Mg or Sb are added in the vapour phase during step c) of the above method. Alternatively, silane or chlorosilane may be added in the vapour phase, particularly when steps b) and c) are achieved by HVPE. When Mg is added in the vapour phase, this can be achieved either in the form of MgCl2 obtained by reaction of HCl over a solid magnesium source or in the form of biscyclopentadienyl magnesium.

In a particular aspect of the invention, a surfactant or antisurfactant chemical species is added in the vapour phase, in order to change the morphology of the growing surface. Said chemical specie may be Oxygen.

Thus, in a preferred method according to the present invention
step b) is achieve at a temperature of about 1020° C. adding $O_2$ in the vapour phase to induce island features, and
step c) is achieved at 1020° C. without $O_2$ to get full coalescence of the island features and achievement of a smooth flat surface.

To get useful thick enough free standing GaN for further processing, the HVPE should last for several hours. This means that the mechanism of reduction of the density of TD, i.e, ULO should take place not only at the beginning of the growth but might be eventually repeated.

In a second embodiment of the present invention, at the early stage of the HVPE growth on GaN/sapphire template, a surface consisting of a coherent array of uneven pyramids is formed. In the present invention, this takes place by growing GaN at a rather low temperature.

At this rather low temperature, GaN grows in the form of coherent island, randomly distributed with random size, thus involving a ULO process.

Figure 2:
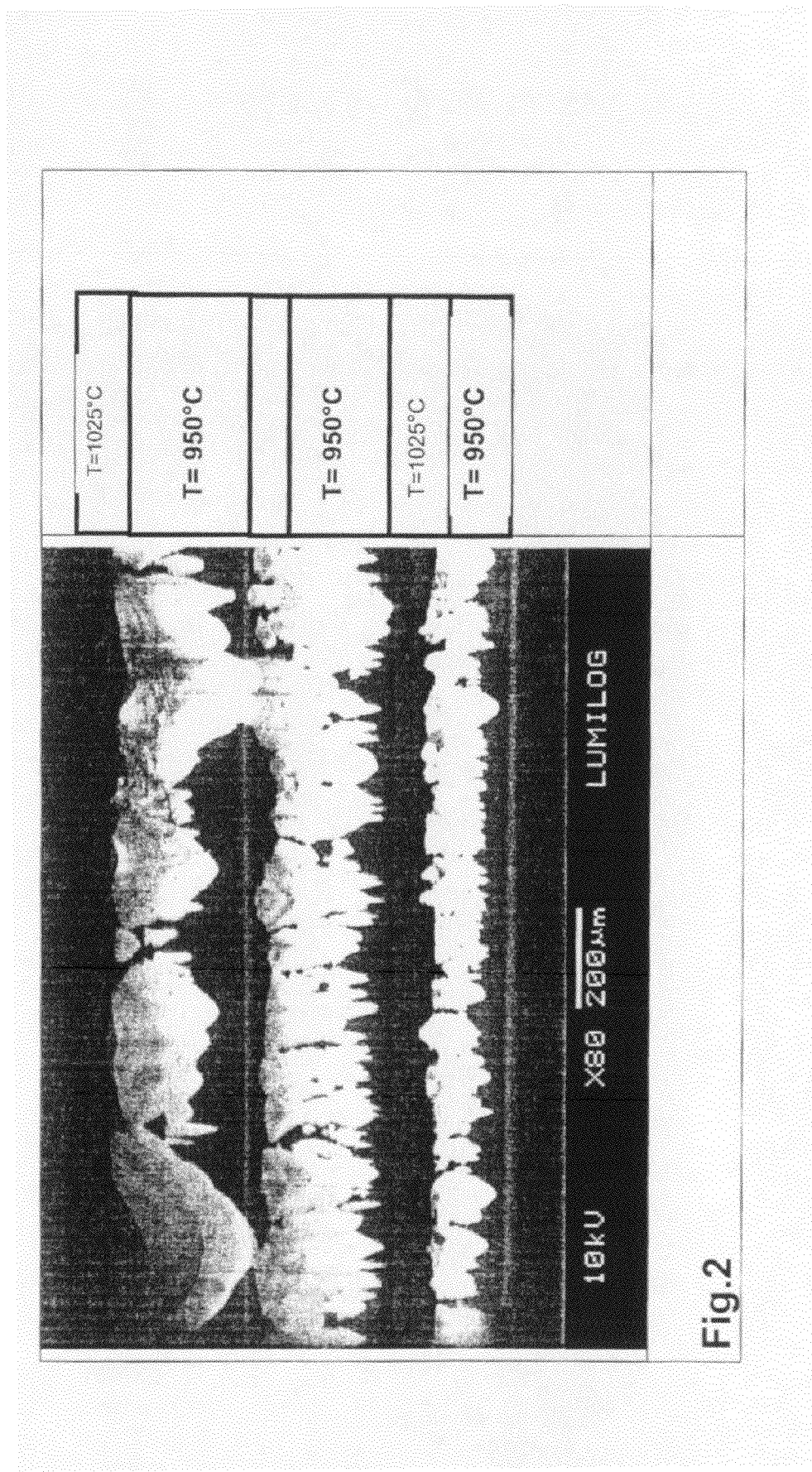
FIG. 2: Panchromatic cathodoluminescence of a thick HVPE layer grown following the present invention, and growth temperatures sequence.

Panchromatic cross sectional cathodoluminescence (CL) examination of this first stage indeed exhibits an uneven dark layer, which corresponds to the island features formation on top of the MOVPE template (FIG. 2). It is well established that inside pyramids in the two-step ELO, the near band gap CL intensity drops. Conversely, in this first layer, growths further proceeds from faceted islands. In this low temperature regime, the lateral growth rate remains low. More specifically, growth proceeds from faceted islands, whereas the (0001) face does not appear. Then, after islands are formed, growth further proceeds from lateral facets. CL intensity become much higher and appear as white because of the enhanced Oxygen incorporation on the lateral facets.

After the low temperature step, the growth temperature is increased.

In these new growth conditions, the lateral growth rate is enhanced and the layer becomes flat. CL corresponding to this high temperature growth step appears as grey, because of the high quality of the GaN layer and the reduced incorporation of Oxygen.

Thus another object of the present invention concerns a method of manufacturing low defect density GaN as described above, wherein
step b) is achieve at a temperature below 950° C. to induce island features, and
step c) is achieved at higher temperature to get full coalescence of the island features and achievement of a smooth flat surface.

The full process can be understood as follows:

When HVPE growth is carried out at low temperature, 3D island growth mode takes place. The basic mechanisms are similar to those occurring in SiN nano-masking, more specifically TD underwent a 90° bending when they met a lateral facet. In these growth conditions, which were defined as ULO, the 3D islanding remains as growth proceeds. It is well established by the person skilled in the art that the incorporation of doping impurities is facet dependant, and therefore the Oxygen incorporation is enhanced on lateral facets, as evidenced by SIMS (FIG. 2).

In the second HVPE step at high temperature, higher partial pressure of ammonia, growth occurs laterally until reappearance of (0001) facets.

TDs that have bent at 90° propagate parallel to the substrate surface until they create a coalescence boundary with a neighbouring growing facets. In this coalescence boundary, they can recombine with another TD, or bent once again either downwards or upwards.

Figure 4:
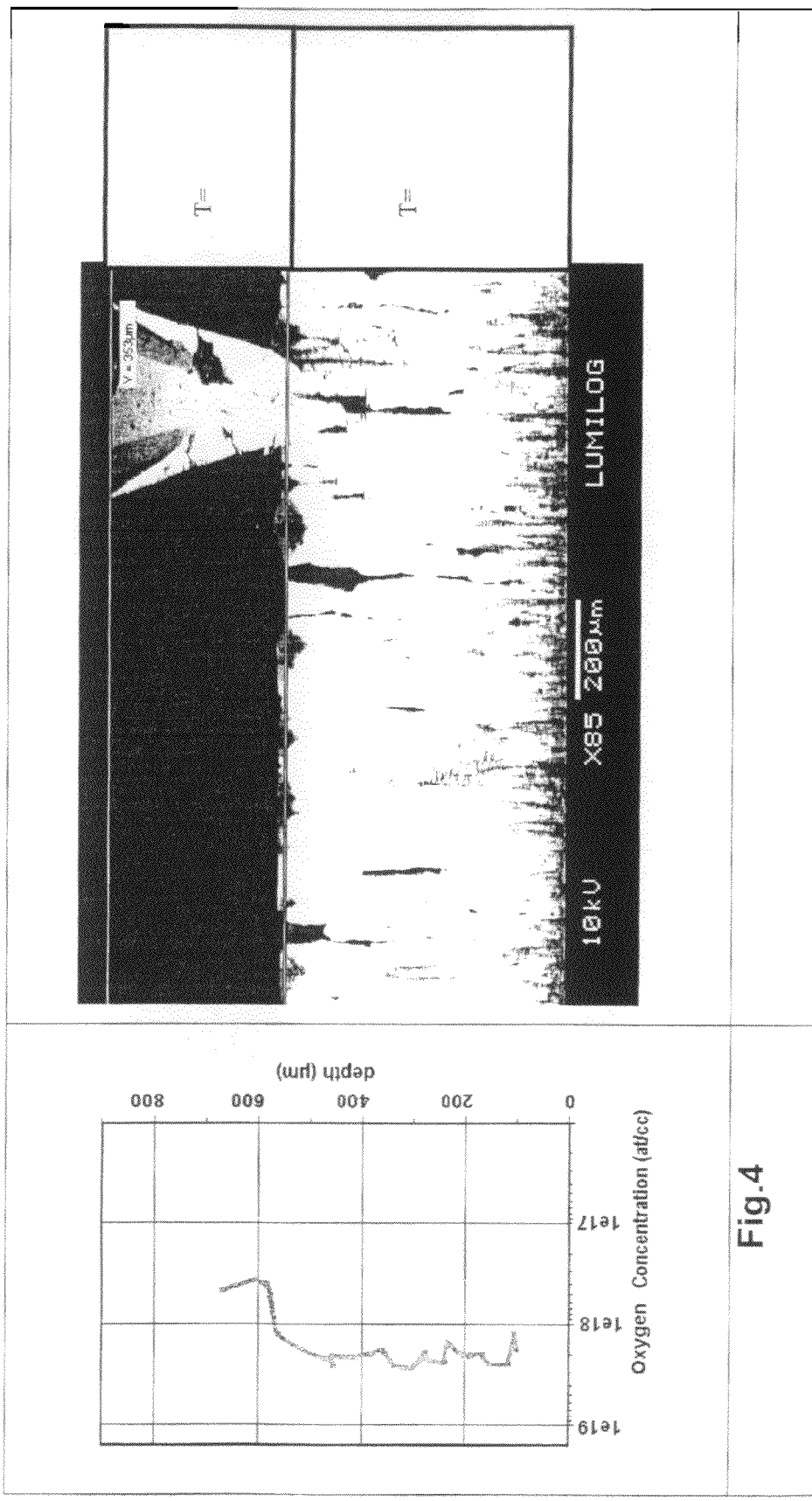
FIG. 4: Cross sectional cathodoluminescence and O SIMS profile of GaN grown by HVPE on MOVPE GaN/Si/Sapphire.

After recovering a flat surface, growth becomes 2D, Oxygen incorporation is one order of magnitude lower than on lateral facets (cross sectional SIMS data).

µ-PL analysis provides further information for an in depth understanding of the growth process (FIG. 4). In the coolest part, the near band gap PL peak is rather broad whereas it is extremely sharp in GaN grown at higher temperature. In addition, excitonic peaks do appear in the high temperature part, this is a proof of the high optical quality of this material. The uppermost part exhibits the sharpest µ-PL peaks with a FWHM <1 meV and their energetic position corresponds to fully relaxed GaN. The µ-PL of the starting GaN template corresponding to the present state of the art presents a FWHM of the excitonic peak ~2 meV.

For many applications a freestanding GaN layer is preferred to even high quality GaN epitaxial layers. Thus in a third preferred embodiment of the present invention, the method of manufacturing described above further include a step wherein the thick layer of GaN is separated from the initial substrate. For that purpose, the ELO quality MOVPE template is either inherently or intentionally engineered to exhibit a mechanical weakness, in a plane parallel to the growth surface, of sufficient magnitude to promote a mechanical failure along that plane, and to result in delaminating of the epitaxial gallium nitride layer due to thermal stress produced as the sapphire substrate and GaN layer are cooled after the growth. In another aspect of this invention, a sacrificial layer is inserted between the sapphire substrate and the thick HVPE layer. To enhance quality of the obtained free standing GaN, the method according to the present invention is ended by polishing the top and bottom surface of the free GaN obtained.

The invention also concerns the thick GaN layer obtained by a method according to the present invention. Preferably, said free standing GaN has a measured lifetime of time resolved photoluminescence (TPRL) of the PL peak corresponding to electron-hole plasma under high excitation 0.4 mJ/cm$^2$ at room temperature higher than 400 ps, and more preferably higher than 800 ps.

The cool-down fracture and delaminating mechanism is particularly advantageous in that it provides a process of stress release alternate to one of cracking through the thickness of the GaN layer, thereby enabling the formation of thick, crack-free, as well as free-standing, GaN layers. Because the GaN layer delaminating generally can be expected to occur near to the growth temperature, a GaN layer cracking mechanism is therefore suppressed.

The present invention will be illustrated referring to the following examples without limiting the scope of the invention.

EXAMPLE 1

Growth of GaN/Sapphire Template with ELO Quality by MOVPE

A (0001) sapphire substrate is used. A very thin film of silicon nitride is formed on the surface of the sapphire, the film being obtained by reaction between $NH_3$ and silane $SiH_4$ for a time short enough to limit the thickness of the film to that of about a few mono layers.

The gaseous vehicle is a mixture of nitrogen and hydrogen in equal proportions. The ammonia is introduced together with the silane, in a form diluted to 50 ppm in hydrogen. Under these conditions, the typical $NH_3$ and $SiH_4$ reaction time is of the order of 30 seconds. This reaction time could be increased up to 360 seconds. This creates either a continuous SiN layer (reaction time 60 seconds) or a discontinuous SiN layer with nanoholes of random size (deposition time 360 seconds)

The successive steps are monitored by laser reflectometry (LR). After the SiN layer coating, a continuous gallium nitride layer having a thickness of 20 to 30 nm is deposited on the SiN film at 600° C. After the deposition of the GaN layer has been completed, it is annealed at a high temperature of the order of 1080° C. Under the combined effect of the temperature rise, of the presence in the gaseous vehicle of a sufficient amount of hydrogen and of the presence of the very thin SiN film beneath the GaN layer and also the antisurfactant effect of silicon, the morphology of said GaN layer undergoes deep modification resulting from solid-phase recrystallization by mass transport. When the temperature approaches 1060° C., the reflectivity of the buffer layer suddenly decreases. The initially continuous GaN buffer layer is then converted into a discontinuous layer formed from GaN pyramids. At the end of this in situ recrystallization process, GaN features or islands of very good crystal quality are obtained, these retaining an epitaxial relationship with the substrate by virtue of the very small thickness of the SiN layer. During the subsequent epitaxial regrowth with gallium nitride, the GaN features or islands will develop by lateral and vertical growth. GaN layers have thus been obtained by full coalescence of the GaN features having a defect density of the order of $5\times10^8$ cm$^2$.

Such GaN/sapphire templates can be used for HVPE regrowth as will be described hereafter.

EXAMPLE 2

Formation of a Free Standing GaN

Using the GaN/sapphire templates of example 1, the HVPE growth starts at about 950° C. In this low temperature step of growing a thick GaN layer by HVPE, the temperature is set at 930-950° C., the partial pressure of HCl, pHCl at 0.03, of NH3, pNH3 at 0.24, the carrier gas, H2, pH2 at 0.73 respectively. The growing pressure was 2.6 kPa.

After the low temperature step, formation of islands, growth temperature is set up to 1025° C., with the following values for the partial pressures of active and carrier gas:
pHCl, 0.02
PNH3, 0.31
pH2, 0.67
Working pressure: 2.6 kPa In these growth conditions, the lateral growth rate is enhanced and the layer becomes flat. CL corresponding to this high temperature growth step appears as grey, because of the high quality of the GaN layer and the reduced incorporation of Oxygen.

The process is repeated several times until a thickness of 500 μm to 2 mm is obtained. CL examination of GaN grown at high temperature reveals first smoothing of the islands features corresponding to high intensity CL emission. Then, when growth becomes 2D, the CL intensity becomes uniform. The FIG. 2 shows an example where the 950-1025° C. alternation has been implemented three times.

SIMS analysis carried out on across section of a thick HVPE layer grown according to the present invention, shows that the oxygen concentration is higher by one order of magnitude in the part corresponding to the coolest growth temperature.

Cross sectional TEM examination on such a free saynding GaN exhibits a rather dense network of TDs near the interface. As the thickness, increases, the density of TD decreases. Most of the dislocation appear to bend at 90° into the basal plane as expected.

When the process low-high temperature growth is applied several times, TD density decreases according to the same basic mechanisms at each step.

The substrates are cooled under NH3 environment to avoid decomposition of the GaN layer during the cool-down.

Once the substrates are cooled and removed from the reactor, they can be further processed. The sapphire substrate can be removed from the GaN epitaxial layer by any suitable process.

Free standing GaN obtained according in this first example exhibit TD density of the order of $5\times10^6$ cm$^2$ when the low-high temperature growth process is applied only once. The TD density reaches $5\times10^5$ cm$^{-2}$ when the low-high temperature growth process is implemented three times as in FIG. 2.

EXAMPLE 3

In this example, three alternate low-high growth temperature growth processes with different temperatures and durations are used. More specifically, it is shown that cross sectional optoelectronic properties of the HVPE layer are linked to the growth process.

The GaN/sapphire templates of example 1, is hereafter introduced in the growth chamber of the HVPE reactor.

The HVPE growth starts at about 930° C. In this low temperature step of growing a thick GaN layer by HVPE, the partial pressure of HCl, pHCl at 0.03, of $NH_3$, $pNH_3$ at 0.24, the carrier gas, $H_2$, $pH_2$ at 0.73 respectively. The growing pressure was 2.6 kPa. At this rather low temperature, GaN grows in the form of coherent island, randomly distributed with random size, thus involving a ULO process.

After the low temperature step, growth temperature is set up to 1015-1020° C., with the following values for the partial pressures of active and carrier gas:
pHCl, 0.02
PNH3, 0.31
pH2, 0.67
Working pressure: 2.6 kPa In these growth conditions, the lateral growth rate is enhanced and the layer becomes flat. The process is repeated several times until a thickness of 500 µm to 2 mm is obtained.

The substrates are cooled under NH3 environment to avoid decomposition of the GaN layer during the cool-down.

Once the substrates are cooled and removed from the reactor, they can be further processed. The sapphire substrate can be removed from the GaN epitaxial layer by any suitable process. Eventually, the thick GaN layer spontaneously delaminates and free standing GaN of several cm2 are obtained. Full 2" wafer are occasionally obtained.

Figure 3:
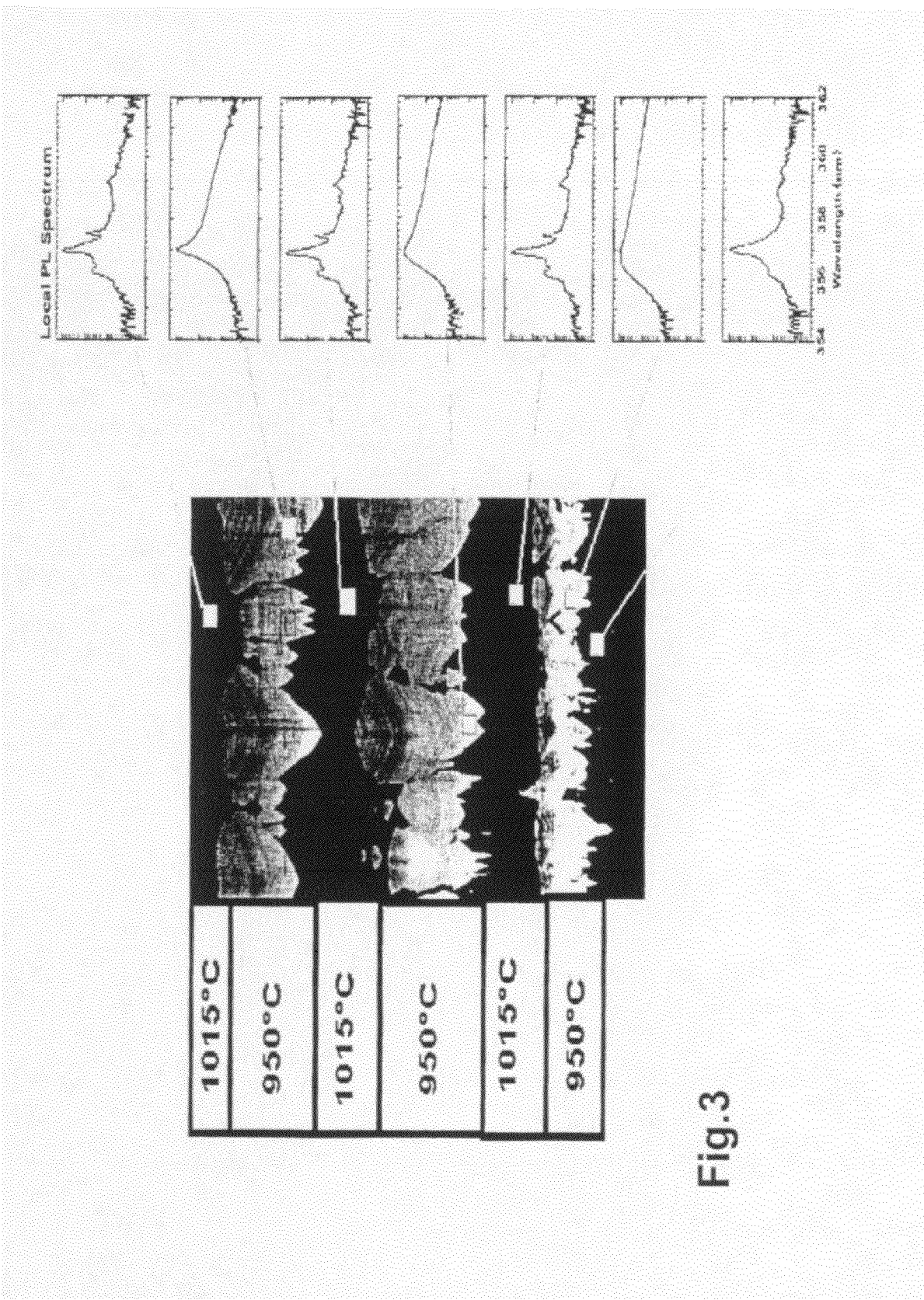
FIG. 3: μ-photoluminescence of a thick HVPE layer grown following the present invention, at different critical steps of the process.

Free standing GaN obtained according in this first example exhibit TD density of the order of $5\times10^6$ $cm^{-2}$ when the low-high temperature growth process is applied only once. The TD density reaches $5\times10^5$ $cm^{-2}$ when the low-high temperature growth process is implemented three times as in FIG. 3.

EXAMPLE 4

In this example, an antisurfactant is added in the vapour phase. More specifically, Oxygen in the form of diluted $O_2$ in $H_2$ (1%) is introduced in the growth chamber using an additional delivery line. In this specific example the smooth (2D) towards island (3D) transition is tuned by the addition of $O_2$, the growth temperature being kept constant at 1020° C. It is well known that the incorporation of Oxygen is facet dependant, in other words as shown in the previous examples, Oxygen is significantly incorporated on lateral facets whereas the incorporation on c-plane is lower by almost two orders of magnitude.

The GaN/sapphire templates of example 1, is hereafter introduced in the growth chamber of the HVPE reactor.

The HVPE growth takes place at about 1020° C., with the following values for the partial pressures of active and carrier gas:
pHCl, 0.02
PNH3, 0.31
pH2, 0.67
Working pressure: 26 kPa In these starting growth conditions, the lateral growth rate is enhanced and the layer remains flat. Oxygen is introduced at a partial pressure of $7\times10^{-5}$, then because of the antisurfactant effect of Oxygen, this produces roughening of the growing surface by the formation of islands with facets. Then, the Oxygen delivery is stopped. As the antisurfactant is discontinued, the surface becomes flat again. The process can be repeated several times until a thickness of 500 µm to 2 mm is obtained.

The substrates are cooled under $NH_3$ environment to avoid decomposition of the GaN layer during the cool-down.

Once the substrates are cooled and removed from the reactor, they can be further processed as described in example 3.

Free standing GaN obtained according in this example exhibit TD density of the order of $5\times10^6$ $cm^{-2}$ when alternative delivery of Oxygen is applied once.

EXAMPLE 5

Production of a Free Standing GaN Using a Sacrificial Layer

The separation process uses a sacrificial layer of Silicium (Si), although other material could be used, which thickness is 0.3 µm. (111) Si is deposited by CVD on (0001) sapphire. Other crystallographic directions for the Si sacrificial layer like <110> are suitable specifically for the growth of non polar {11-22} a-plane GaN, this however requires R-plane sapphire as starting substrate. Advantageously the (111) Si layer is deposited directly in the MOVPE reactor from pure silane.

Direct growth of GaN on (111) Si by MOVPE does not lead to high quality layers. Conversely, a layer like SiC or AlN has proven to be beneficial for the quality of the GaN layer. Thus 0.15 µm thick AlN layer is deposited on (111) Si by MOVPE using growth process well known by the skilled person in the art.

GaN is grown by MOVPE from trimethyl gallium and ammonia with hydrogen as a carrier gas using well known technologies as described in example 1.

The growth temperature was maintained below 960° C. to avoid premature evaporation of the sacrificial Si interlayer.

According to the present invention the next step is to grow a thick GaN layer by HVPE in such conditions as to significantly reduce the TD density by implementing an ULO process at the very first stage of the growth.

The HVPE growth starts at about 950° C. In this low temperature step of growing a thick GaN layer by HVPE, the temperature is set at 930-950° C., the partial pressure of HCl, pHCl at 0.03, of NH3, pNH3 at 0.24, the carrier gas, H2, pH2 at 0.73 respectively. The growing pressure was 2.6 kPa. Growth is carried out during 10 hours at a growth rate of about 100 µm/h.

At this rather low temperature, GaN grows in the form of coherent island, randomly distributed with random size, thus involving an ULO process.

Panchromatic cross sectional cathodoluminescence (CL) examination of this first stage indeed exhibits an uneven dark layer, which corresponds to the island features formation on top of the MOVPE template (FIG. 4). Conversely, in this first layer, growths further proceeds from faceted islands. In this low temperature regime, the lateral growth rate remains low. More specifically, growth proceeds from faceted islands. CL intensity become much higher and appear as white because the enhanced O incorporation on the lateral facets.

After the low temperature step, growth temperature is set up to 1015-1020° C., with the following values for the partial pressures of active and carrier gas:
pHCl, 0.02
PNH3, 0.31
pH2, 0.67
Working pressure: 2.6 kPa In these growth conditions, the lateral growth rate is enhanced and the layer becomes flat. Then, when growth becomes 2D, the CL intensity is uniform. The growth further proceeds. CL examination of GaN grown at high temperature reveals first smoothing of the islands features corresponding to high CL emission, and then CL emission becomes uniform. This corresponds to 2D growth of GaN parallel to the basal plane.

The Oxygen concentration as measured by SIMS exhibits the same trend as observed in the first embodiment, the Oxygen decrease by almost one order of magnitude when the growth temperature is 1015° C.

During this second hich temperature step, where lateral growth is enhanced, the sacrificial Si interlayer evaporates and a clean separation takes place.

Such a process produces free standing GaN 2" wafers with TDs density in the low $10^6$ cm$^{-2}$ Transmission Electron Microscopy examination on the whole thickness of the sample reveals that the TD density continuously decreases from the initial interface up to the top surface. Bending at 90° of TD is observed as expected in the ULO process. Instead of growing GaN on Si deposited on sapphire in the MOVPE reactor, commercial Silicon on sapphire (SOS) either on C- or R-plane may be used.

EXAMPLE 6

Production of a Free Standing GaN Using Ion Implantation to Induce Separation from the Substrate An ELO quality GaN/sapphire template described in example 1 is implanted by ions H$^+$ in such a way that microcavities 5 are created at a depth of 100 nm.

The energies range between 80 and 150 keV and during implantation the GaN/sapphire template is maintained at room temperature. Atomic rearrangements takes place between 900 and 1150° C. The H$^+$ fluxes were between $1 \times 10^{15}$ and $5 \times 10^7$ cm$^{-2}$.

Figure 5:
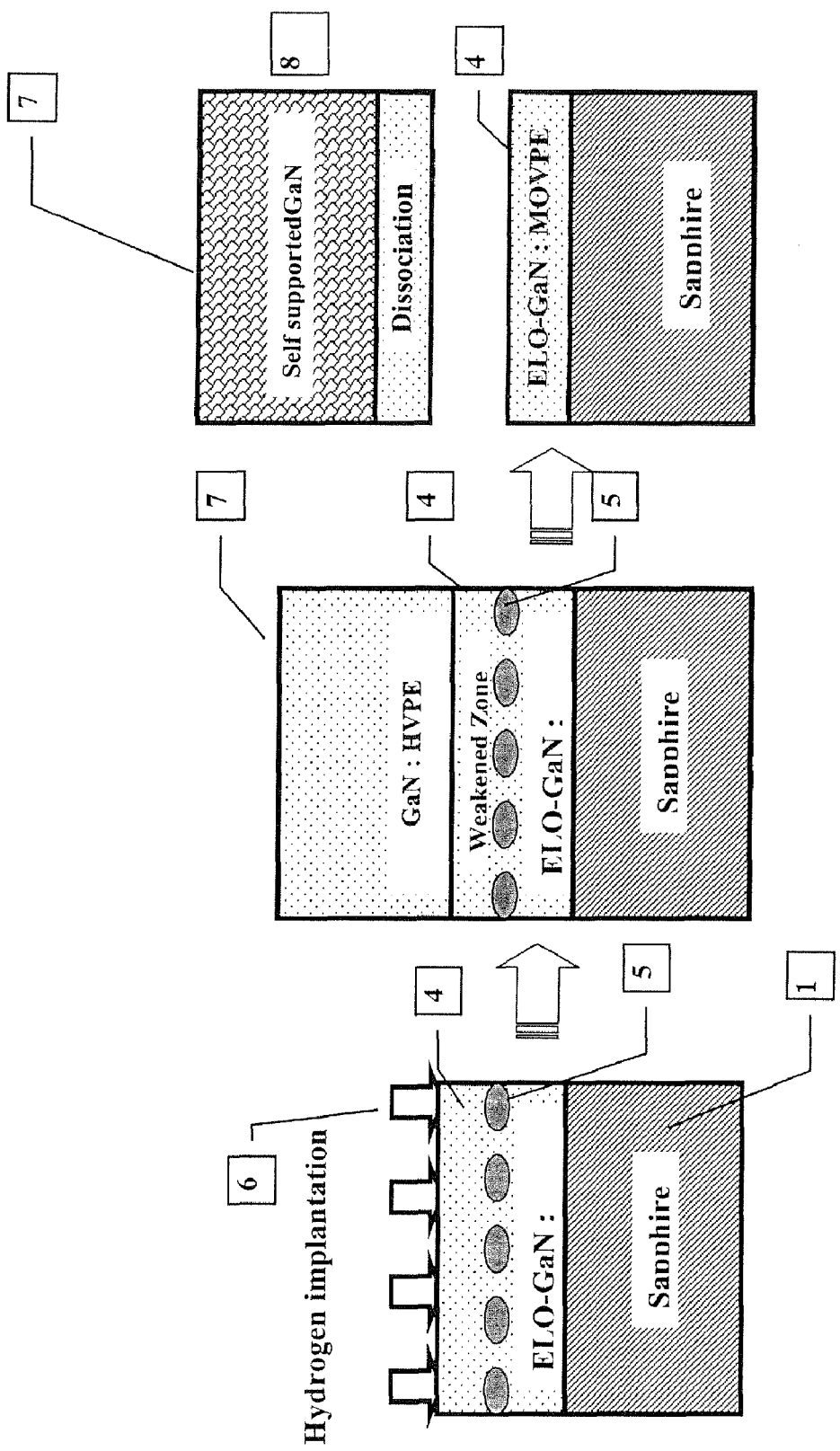
FIG. 5: Schematic process to produce ULO quality HVPE GaN and to separate the starting substrate by $H^+$ implantation.

This MOVPE layer where H+ has been implanted is then introduced in the HVPE growth chamber. Indeed, even though brittle to some extend due to H+ implantation, this GaN implanted layer can be easily handed. The whole process is schematically shown on FIG. 5.

The HVPE growth starts at about 950° C. In this low temperature step of growing a thick GaN layer by HVPE, the temperature is set at 930-950° C., the partial pressure of HCl, pHCl at 0.03, of NH$_3$, pNH$_3$ at 0.24, the carrier gas, H$_2$, pH$_2$ at 0.73 respectively. The growing pressure was 2.6 kPa. Growth is carried out during 10 at a growth rate of about 100 μm/h At this rather low temperature, GaN grows in the form of coherent island, randomly distributed with random size, thus involving an ULO process.

After the low temperature step, growth temperature is set up to 1015-1020° C., with the following values for the partial pressures of active and carrier gas:

pHCl, 0.02
PNH3, 0.31
pH2, 0.67
Working pressure: 2.6 kPa

In these growth conditions, the lateral growth rate is enhanced and the layer becomes flat. Then, when growth becomes 2D, the CL intensity is uniform. The growth further proceeds.

During this HVPE growth taking place at high temperatures, the H+ implanted region induces a self separation which is eventually enhanced during cooling by the difference in thermal expansion coefficient between GaN and sapphire, thus producing sponaneously free standing GaN.

Such a process produces free standing GaN 2" wafers with TDs density in the low $10^6$ cm$^{-2}$.

Instead of growing GaN on Si deposited on sapphire in the MOVPE reactor, commercial Silicon on sapphire (SOS), either on C- or R-plane could be used.

What is claimed is:

1. A method of manufacturing low defect density GaN involving the following steps:
    a) growth of an epitaxial layer of GaN directly on a surface of a substrate, wherein the substrate is chosen from the group consisting of sapphire, spinel, GaN, AlN, GaAs, Si, SiC (6H-, 4H-, 3C-), LiAlO$_2$, LiGaO$_2$, ZrB$_2$, and HfB$_2$;
    b) subsequent growth of a GaN layer to form island features; and
    c) growth of a GaN layer from the island features at conditions where lateral growth is enhanced until full coalescence of the island features without using any kind of mask, wherein step b) is achieved without using any kind of mask, nor roughening, nor etching, nor grooving the GaN surface, and only by changing a combination of the operating pressure in the growth chamber, the partial pressure, the temperature, the V/III ratio and/or surfactant or antisurfactant chemical species in the vapour phase, wherein the temperature during step b) is below 950° C., and wherein growth of the GaN layer is carried out at a rate of at least about 50 microns/hour.

2. A method according to claim 1, wherein the steps b) and c) of subsequent growth of GaN to produce island features and smooth surface is repeated several times.

3. A method according to claim 2, wherein Magnesium is added in the vapour phase either in the form of MgCl$_2$ obtained by reaction of HCl over a solid magnesium source or in the form of biscyclopentadienyl magnesium.

4. A method according to claim 1, in which the steps b) and c) are achieved by Hydride Vapor Phase Epitaxy (HVPE).

5. A method according to claim 4, wherein either silane or chlorosilane is added in the vapour phase.

6. A method according to claim 4, wherein, in a further step, the GaN layer has been separated from the substrate as a freestanding GaN layer.

7. A method according to claim 6, wherein the top and the bottom surface of the freestanding GaN layer are polished.

8. A method according to claim 6, wherein the ELO quality MOVPE substrate is beforehand or inherently engineered to exhibit a mechanical weakness, in a plane parallel to the growth surface, of sufficient magnitude to promote a mechanical failure along that plane, and to result in delaminating of the epitaxial gallium nitride layer due to thermal stress produced as the substrate and GaN layer are separated by cooling after the growth.

9. A free standing GaN layer obtained by a process according to claim 6, wherein the measured lifetime of time resolved photoluminescence (TPRL) of the PL peak corresponding to electron-hole plasma under high excitation 0.4 mJ/cm$^2$ at room temperature is higher than 400 ps.

10. A free standing GaN layer according to claim 9, wherein the measured lifetime of time resolved photoluminescence (TPRL) of the PL peak corresponding to electron-hole plasma under high excitation 0.4 mJ/cm$^2$ at room temperature is higher than 800 ps.

11. A free standing GaN layer according to claim 9, wherein the TD densities are $10^6$ cm$^2$.

12. A method according to claim 1, in which the steps b) and c) are achieved by close space vapour transport (CSVT).

13. A method according to claim 1, in which the steps b) and c) are achieved by Liquid Phase Epitaxy (LPE).

14. A method according to claim 1 in which: step c) is achieved at higher temperature than the temperature of step b) to get full coalescence of the island features and achievement of a smooth flat surface.

15. A method according to claim 1 in which:
step b) is achieved by adding $O_2$ in the vapour phase to induce island features, and
step c) is achieved at 1020° C. without $O_2$ to get full coalescence of the island features and achievement of a smooth flat surface.

16. A method according to claim 1, wherein the step c) is achieved by the addition of Mg or Sb in the vapour phase.

17. A thick GaN layer obtained by a process according to one of claims 1 to 3.

* * * * *

UNITED STATES PATENT AND TRADEMARK OFFICE
CERTIFICATE OF CORRECTION

| | | |
|---|---|---|
| PATENT NO. | : 8,283,239 B2 | Page 1 of 1 |
| APPLICATION NO. | : 12/086674 | |
| DATED | : October 9, 2012 | |
| INVENTOR(S) | : Bernard Beaumont et al. | |

It is certified that error appears in the above-identified patent and that said Letters Patent is hereby corrected as shown below:

In the Claims:

Column 16, Line 4, Claim 17, please delete "1 to 3" and insert therefor -- 1 to 5 or 12 to 16 --

Signed and Sealed this
Twenty-fourth Day of June, 2014

Michelle K. Lee
*Deputy Director of the United States Patent and Trademark Office*